United States Patent [19]

Sasaki

[11] Patent Number: 4,665,419
[45] Date of Patent: May 12, 1987

[54] SEMICONDUCTOR DEVICE

[75] Inventor: Nobuo Sasaki, Kawasaki, Japan

[73] Assignee: Fujitsu Limited, Kawasaki, Japan

[21] Appl. No.: 846,486

[22] Filed: Apr. 1, 1986

Related U.S. Application Data

[63] Continuation of Ser. No. 478,728, Mar. 25, 1983, abandoned.

[30] Foreign Application Priority Data

Mar. 26, 1982 [JP] Japan ................................. 57-49765
Mar. 31, 1982 [JP] Japan ................................. 57-54594

[51] Int. Cl.$^4$ ............................................ H01L 29/78
[52] U.S. Cl. ..................... 357/23.7; 357/4; 357/49
[58] Field of Search ............................ 357/4, 23.7, 49

[56] References Cited

U.S. PATENT DOCUMENTS

| | | | |
|---|---|---|---|
| 3,484,662 | 12/1909 | Hagon | 357/23.7 |
| 3,658,586 | 3/1972 | Wang | 357/23.7 |
| 3,743,552 | 7/1973 | Fa . | |
| 4,348,804 | 9/1982 | Ogawa | 357/4 X |
| 4,418,470 | 12/1983 | Naster | 357/23.7 |

FOREIGN PATENT DOCUMENTS 1160744 8/1969 United Kingdom .

OTHER PUBLICATIONS

IBM Technical Disclosure Bulletin, vol. 20, No. 4, Sep. 1977, "Extending the Minimal Dimensions of Photolithographic Integrated-Circuit Fabrication Processing", by Abbas et al., pp. 1376–1378.
Electronics International, vol. 50, No. 11, May 1977, "Process Refinements Bring C-MOS on Sapphire into Commercial Use", by Capell et al., pp. 99–105.

Primary Examiner—Martin H. Edlow
Attorney, Agent, or Firm—Staas & Halsey

[57] ABSTRACT

A semiconductor device, particularly, an SOS type MOS IC, has semiconductor islands for elements (i.e., active regions). An insulator region isolating the islands includes stripe portions and wide portions at points where the stripe portions join. The stripe portions are formed by oxidizing sides of silicon island portions and have a width of from 30 nm to 2 μm. At the same time, the wide portions are formed by oxidizing completely thin bridge portions of the silicon island portions. A gate electrode with a gate insulating layer runs across one of the semiconductor islands and an end of the gate electrode is present above the adjacent semiconductor island.

9 Claims, 12 Drawing Figures

SEMICONDUCTOR DEVICE

This is a continuation of co-pending application Ser. No. 478,728 filed on Mar. 25, 1983.

BACKGROUND OF THE INVENTION (1) Field of the Invention

The present invention relates to a semiconductor device, more particularly to a metal-oxide-semiconductor (MOS) field effect transistor (FET) having a narrow insulator isolation region and a method for producing the MOS FET. The present invention is preferably applied to a silicon-on-sapphire (SOS) type MOS integrated circuit (IC).

(2) Description of the Prior Art

Conventional SOS type IC's comprises MOS FET's formed by epitaxially forming a silicon layer on a sapphire (or spinel) substrate, introducing N-type or P-type impurities into the silicon layer, and forming a gate electrode with a gate oxide layer on the silicon layer. Since the substrate of the SOS type IC is made of a sapphire insulator, the capacitance between the substrate and doped regions (source and drain regions) and the stray capacitance between the substrate and conductor lines are very small. This has resulted in wide use of SOS type IC's.

In order to increase the yield and reliability of SOS type IC's, an insulator (of $SiO_2$) isolation region has been formed between the MOS FET's on the sapphire substrate (for example, cf. Alan Capell, et al., "Process Refinements Bring C-MOS on Sapphire into Commercial Use", Electronics May 26, 1977, pp. 99 to 105). In order to increase the density of SOS type IC's, it has been proposed to decrease the width of the isolation region (i.e., an $SiO_2$ layer) to be from 30 nm to 50 nm, which is the thickness of the gate oxide layer. According to this proposal, semiconductor islands surrounded with narrow isolation regions are formed on a sapphire substrate.

The formation of semiconductor islands surrounded by narrow isolation regions, however, has problems such as formation of unused semiconductor regions.

SUMMARY OF THE INVENTION

An object of the present invention is to provide a semiconductor device in which an insulator region, isolating elements from each other, is formed without resulting in unused semiconductor regions.

Another object of the present invention is to provide a semiconductor device having a narrow insulator region having a width as low as 30 nm.

Still another object of the present invention is to provide a method for producing a semiconductor device having both a narrow insulator region and wide insulating regions for conductor lines including bonding pads.

Still another object of the present invention is to provide a semiconductor device in which a gate electrode is easily formed.

Still another object of the present invention is to increase the density of a semiconductor device.

According to the present invention, a semiconductor device comprises a base body; an insulator region formed on the base body; a plurality of active regions of semiconductor islands electrically isolated from each other by the insulator region; and gate electrodes each of which extends across one of the active regions and terminates at another one of the active regions adjacent to the one of the active regions. That is, an end of the gate electrode is present above the adjacent semiconductor island.

According to the present invention, a semiconductor device comprises: a base body and an insulator region formed on the base body, insulator the region having first and second stripe portions extending in different directions from each other and also having a portion formed at a cross point of the first and second stripe portions, being wider than the first and second stripe portions. Active regions of semiconductor islands are formed on the base body and are surrounded by the insulator region. It is preferable that the width of the stripe insulator portions be from 30 nm to 2 $\mu$m. The narrower the width of the stripe insulator portion becomes, the denser the semiconductor device which can be produced. The stripe insulator portions are formed by oxidizing sides of semiconductor islands formed on an insulating substrate.

DESCRIPTION OF THE PREFERRED EMBODIMENTS

Before describing the preferred embodiments of the invention, a discussion will be made of a prior art technique for the formation of semiconductor islands surrounded by narrow isolation regions.

Figure 1:
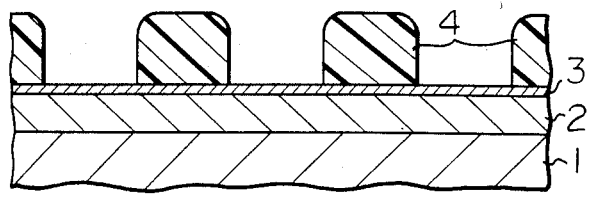
FIGS. 1 through 5 are partial cross-sectional views of a semiconductor device in various stages of its production in accordance with a prior art technique.

The method of formation is illustrated in FIGS. 1 to 5. As shown in FIG. 1, a sapphire substrate 1 has a single crystalline silicon layer 2 epitaxially formed on there by a chemical vapor deposition (CVD) technique. A silicon nitride ($Si_3N_4$) layer 3 is formed on the silicon layer 2 by a CVD technique and then a patterned photoresist layer 4 is formed on the $Si_3N_4$ layer 3.

Figure 2:
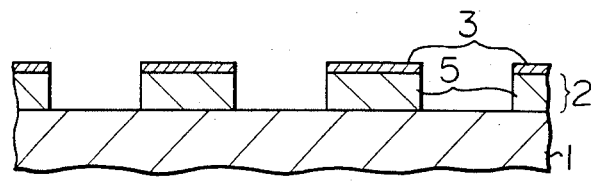

As illustrated in FIG. 2, using the patterned photoresist layer 4 as a mask, the $Si_3N_4$ layer 3 is selectively etched by a suitable etchant, e.g., a phosphoric acid ($H_3PO_4$) solution, to form $Si_3N_4$ islands 3 and to expose portions of the silicon layer 2. Next, the exposed portions of the silicon layer 2 are etched by a suitable etchant, e.g., carbon tetrafluoride ($CF_4$) gas, to form silicon islands 5. The patterned photoresist layer 4 is then removed by a suitable remover.

Figure 3:
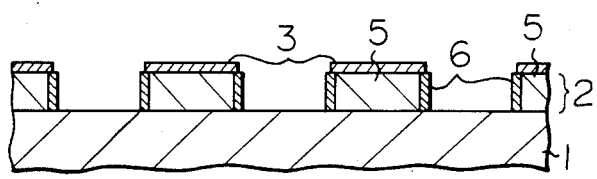
Figure 6:
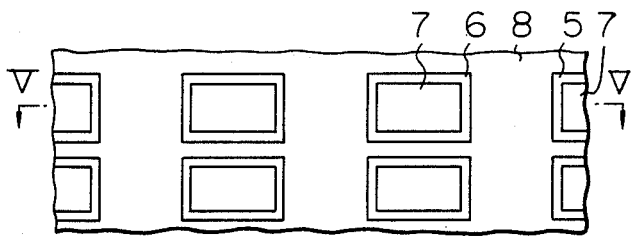
FIG. 6 is a partial plan view of the semiconductor device of FIG. 5.

As illustrated in FIG. 3, the sapphire substrate 1 with the silicon islands 5 is then heated in an oxidizing atmosphere to thermally oxidize the sides of the silicon islands 5, whereby silicon dioxide ($SiO_2$) layers 6 having a thickness of at least 30 nm are formed. Since the top surfaces of the silicon islands 5 are covered with the $Si_3N_4$ islands 3, the top surfaces are not oxidized. The $SiO_2$ regions surround each of the silicon islands 5, as shown in FIG. 6.

Figure 4:
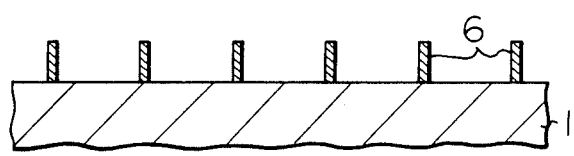

As illustrated in FIG. 4, the Si₃N₄ islands 3 are removed by etching by the H₃PO₄ solution to expose the top surface of the silicon islands 5. Then the silicon islands 4 are removed by means of a plasma-etching technique using the CF₄ gas. The SiO₂ layers 6 remain on the sapphire substrate 1.

Figure 5:
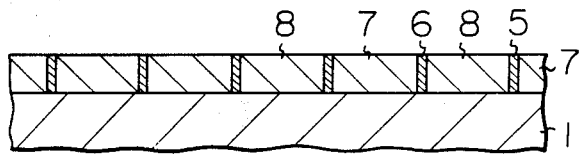

As illustrated in FIG. 5, silicon is epitaxially deposited on the sapphire substrate 1 by means of a CVD technique. Then, the deposited silicon layer is ground to the same level as the height of the SiO₂ layers 6. The result is single crystalline silicon islands (i.e., active regions) 7 surrounded by the SiO₂ layers 6 and a single crystalline silicon part 8, as illustrated in FIGS. 5 and 6.

Each of the silicon islands 7 is isolated from each other and from the silicon part 8 by the SiO₂ layer 6. Impurities are doped into the silicon islands 7 and gate electrodes with gate insulating layers are formed on the silicon islands 7 to form an element, such as an SOS type MOS FET (not shown).

Since the width of the SiO₂ layers 6 (i.e., isolation regions between elements) can be considerably decreased, it is possible to increase the density of the semiconductor device. However, there is an unused silicon part 8 present between the adjacent SiO₂ layers 6 surrounding the silicon islands 7. The distance between the adjacent silicon islands 7 is twice the width of the SiO₂ layers 6 plus the width of the unused silicon part 8. Therefore, the advantage of decreasing the SiO₂ layer width (i.e., the isolation region width) cannot be fully achieved.

In the above-mentioned method, insulating layers having a relatively large area for conductor lines, including bonding pads, cannot be formed without generating stray capacitance. Furthermore, it is very difficult to form a gate electrode with an end present between adjacent silicon (i.e., semiconductor) islands due to the shorter distance between islands compared with the alignment tolerance (e.g., about 1 μm) for patterning, which is about 1 μm. If the gate electrode does not run across a semiconductor island (namely, the end of it is present above the semiconductor), a leakage current occurs between the source region and the drain region occurs and the MOS FET obtained results in a defective product.

Figure 7:
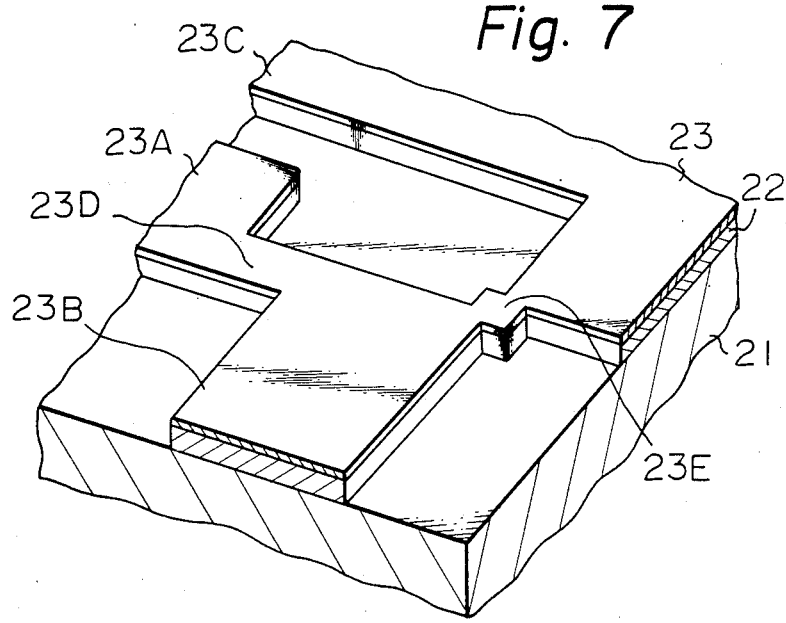
FIGS. 7 through 11 are partial perspective views of a semiconductor device in various stages of its production in accordance with a method of the present invention.

Referring to FIGS. 7 through 11, a process for producing a semiconductor device comprising SOS type MOS FET's in accordance with an embodiment of the present invention will now be explained. As illustrated in FIG. 7 a sapphire substrate 21 has a single crystalline silicon layer 22 having a thickness of, e.g., about 0.6 μm (micrometers), is epitaxially formed by a CVD technique. A Si₃N₄ layer 23 having a thickness of, e.g., from 0.2 to 0.3 μm, is formed on the silicon layer 22 by a CVD technique. A patterned photoresist layer (not shown) is formed on the Si₃N₄ layer 23. The Si₃N₄ layer 23 and the silicon layer 22 are successively etched by means of a plasma-etching technique using CF₄ gas. Then, the patterned photoresist layer is removed to expose the patterned Si₃N₄ layer 23 and silicon layer 22. According to the present invention, the patterned Si₃N₄ layer 23 comprises island portions 23A, 23B, and 23C and bridge portions 23D and 23E which connect adjacent island portions at corners the island portions.

Figure 8:
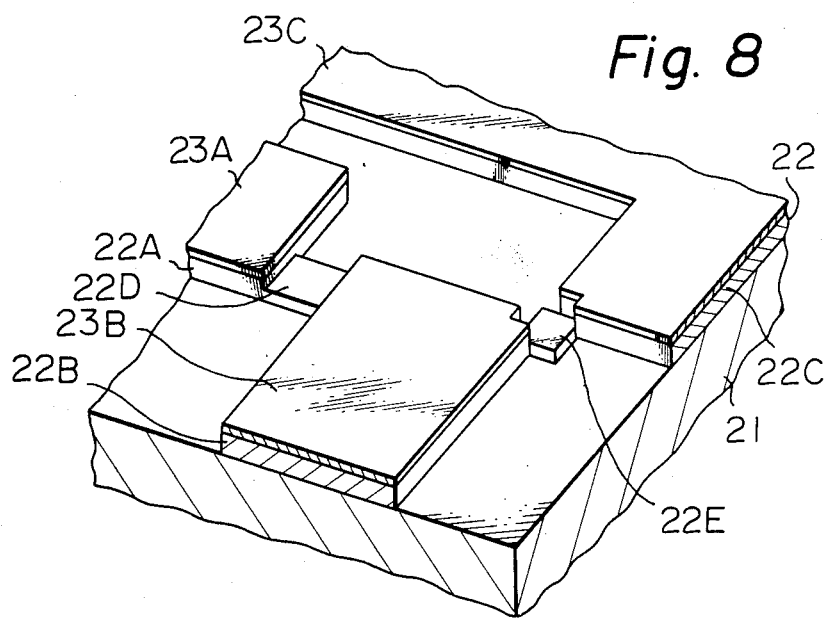

Next another photoresist layer (not shown) is applied on the entire surface of the patterned Si₃N₄ layer 23 and the sapphire substrate 21, is exposed and developed to form openings in the photoresist layer in which the bridge portions 23D and 23E are exposed. Through the openings, the bridge portions 23D and 23E of the Si₃N₄ layer 23 are removed by a plasma-etching technique using CF₄ gas. Then, portions of the silicon layer 22 located under the bridge portions 23D and 23E are successively etched by the plasma-etching technique so as to decrease the thickness of the silicon layer 22 by about half (i.e., about 0.3 μm). After the removal of the photoresist layer, the Si₃N₄ island portions 23A, 23B, and 23C and the patterned silicon layer 22 remain, as illustrated in FIG. 8. The island portions 23A, 23B, and 23C are separated from each other, and the patterned silicon layer 22 comprises island portions 22A, 22B, and 22C lying under the Si₃N₄ island portions 23A, 23B, ad 23C, respectively, and thin bridge portions 22D and 22E.

Figure 9:
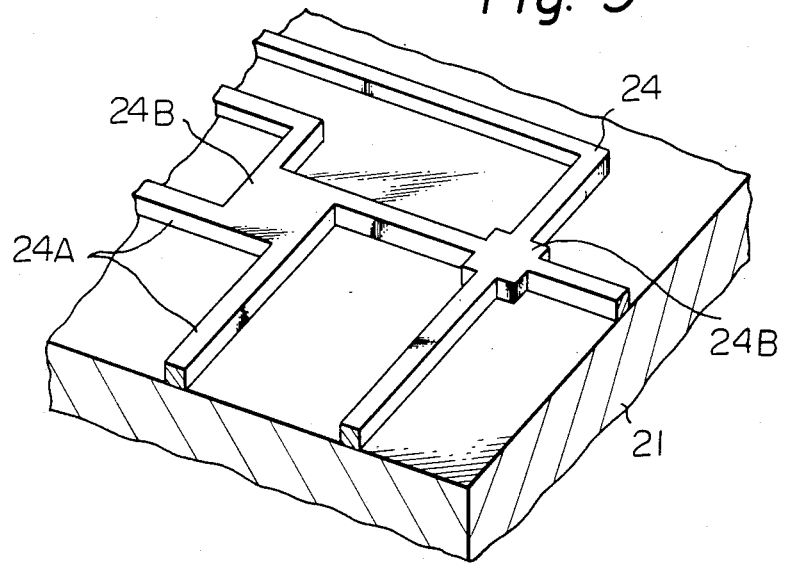

The sapphire substrate 21 is then heated in an oxidizing atmosphere to thermally oxidize the exposed surface of the patterned silicon layer 22. That is, the sides of the island portions 22A, 22B, and 22C are oxidized to form silicon dioxide (SiO₂) stripes 24A having a thickness of, e.g., 0.6 μm. Simultaneously, the bridge portions 22D and 22E are completely oxidized to form wide silicon dioxide (SiO₂) portions 24B. Then, the Si₃N₄ island portions 23A, 23B, and 23C and the silicon island portions 22A, 22B, and 22C are successively removed by means of a plasma-etching technique using CF₄ gas. It is also possible to remove the Si₃N₄ island portions by means of a wet-etching technique using a H₃PO₄ solution and then remove the silicon island portions by means of a plasma-etching technique using trifluormethane gas or a wet-etching technique using a solution of hydrofluoric acid and nitric acid. Since the above-mentioned etchant etches little silicon dioxide, the SiO₂ stripes 24A and the wide SiO₂ portions 24B comprising an insulator region 24 remain, as illustrated in FIG. 9. In this case, the wide SiO₂ portions 24B have a height of about 0.6 μm, almost the same as the thickness of the silicon layer 22 (namely, the same level as the SiO₂ stripes 24A), and connect the SiO₂ stripes.

Figure 10:
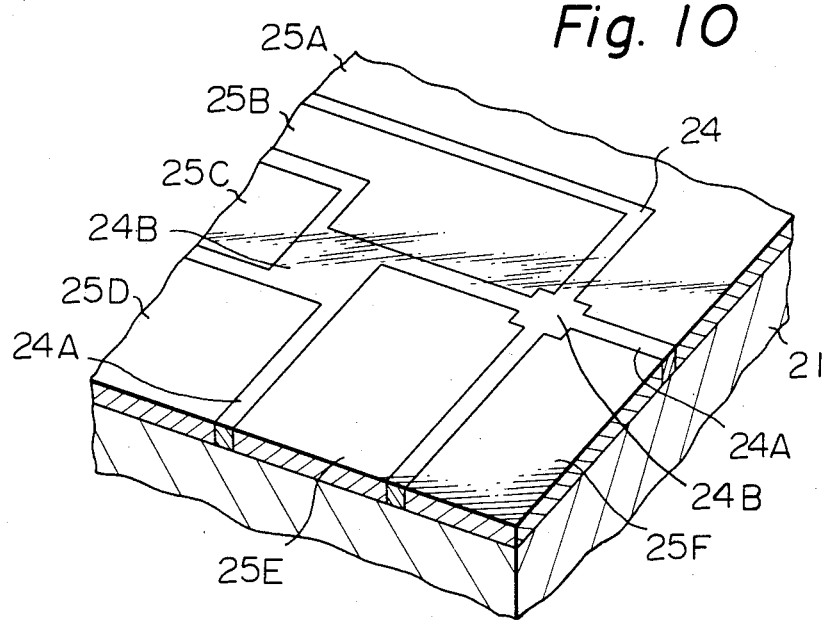

As illustrated in FIG. 10, next, silicon is epitaxially grown on the sapphire substrate 21 by means of a CVD technique. The grown silicon layer is ground to the same level as the height of the SiO₂ stripes 24A (i.e., the height of the insulator region 24). Thus, single crystalline silicon islands (i.e., active regions) 25A through 25F, isolated from each other by the insulator region 24, are formed.

Figure 11:
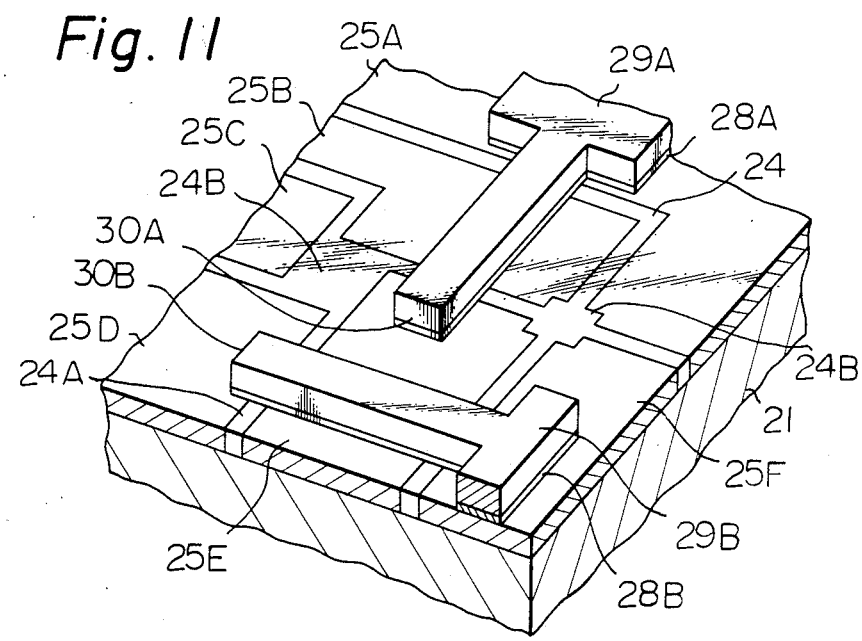

Then, in accordance with a conventional MOS FET method producing method, a gate insulating layer, a gate electrode and doped regions (i.e., a source region and a drain region) are formed. For example, a SiO₂ layer for gate insulating layers 28A and 28B is deposited on the entire surface of the silicon islands 25A through 25F and the insulator region 24 by means of a CVD technique. A polycrystalline silicon layer for gate electrodes 29A and 29B (FIG. 11) is deposited on the SiO₂ layer by means of a CVD technique. A patterned photoresist layer (not shown) is formed on the polycrystalline silicon layer. Using the patterned photoresist layer as a mask, the polycrystalline silicon layer and the SiO₂ layer are etched to form the polycrystalline silicon gates 29A and 29B and the gate insulating layers 28A and 28B, respectively, as illustrated in FIG. 11. After the removal of the patterned photoresist layer, another patterned photoresist layer is formed on the predetermined surface. Using the gate electrodes 29A and 29B and another patterned photoresist layer as a mask, impurities (phosphorus, boron, etc.) are doped in at least the silicon islands 25B and 25E to form source regions and drain regions. In this case, two SOS type MOS FET's are produced.

According to the present invention, the gate electrodes 29A and 29B run across the silicon islands 25B and 25E and the ends 30A and 30B are present above the adjacent silicon islands 25E and 25D, respectively. According to the present invention, the difficult task of forming gate electrodes with ends above a SiO$_2$ stripe (i.e., a narrow isolation region) having a width of, e.g., about 0.6 μm, is unnecessary.

Furthermore, since there is only the narrow SiO$_2$ stripe between the adjacent silicon islands, the total area of the isolation region can be decreased as compared with a conventional semiconductor device. Therefore, the density of the semiconductor device can be increased. It is possible to form large SiO$_2$ layers for conductor lines and bonding pads on the sapphire substrate in the same manner as the formation of the wide SiO$_2$ portions of the insulator region.

Figure 12:
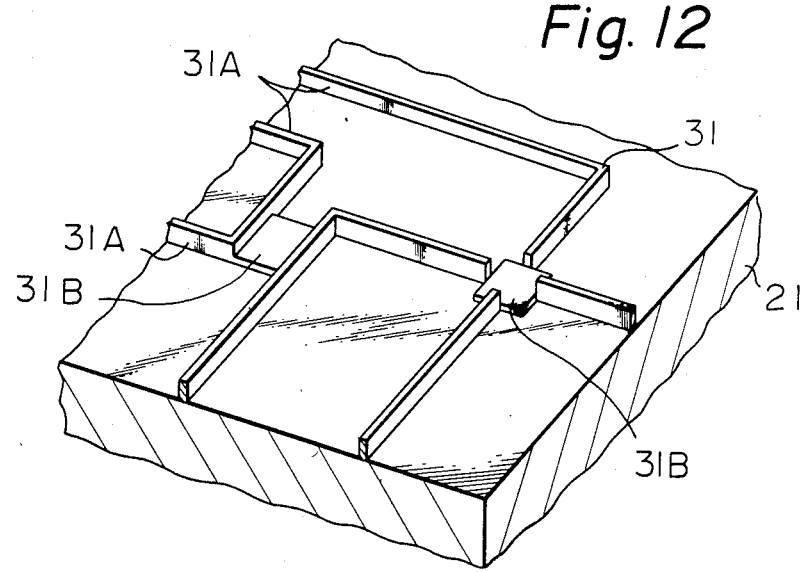
FIG. 12 is a partial perspective view of an insulator region formed on a sapphire substrate in a stage of production of a semiconductor device of the present invention.

According to another embodiment of the present invention, an insulator region 31 comprising very narrow (i.e., thin) SiO$_2$ stripes 31A and wide thin SiO$_2$ portions 31B, is formed, as illustrated in FIG. 12. In this case, in the step for etching the Si$_3$N$_4$ bridge portions 23D and 24E and the bridge portions 22D and 22E of the silicon layer 22 (FIG. 8), the bridge portions 22D and 22E are etched to a very thin thickness of, e.g., about 15 nm. then, the sides of the island portions 22A, 22B, and 22C are oxidized to form SiO$_2$ stripes 31A having a height of 6.0 μm and a width of 30 nm. Simultaneously, the thin bridge portions 22D and 22E are completely oxidized to form the wide and thin SiO$_2$ portions 31B having a thickness of 30 nm. The formation of silicon islands, the formation of gate electrodes with gate insulating layers, and the doping of impurities are carried out in a similar manner to the above-mentioned manner to produce SOS type MOS FET's.

It will be obvious that the present invention is not restricted to the above-mentioned embodiments and that many variations are possible for persons with ordinary skill in the art without departing from the scope of the present invention.

I claim:

1. A semiconductor device comprising:
   an insulating body;
   an insulator region formed on said insulating body and composed of stripe portions extending in different directions from each other and intersecting each other, an intersecting portion formed at the intersection of said stripe portions and being wider than said stripe portions;
   a plurality of active regions of semiconductor islands formed on said insulating body and electrically isolated from each other by said insulator region, said insulator region and said semiconductor islands forming a substantially flat surface;
   gate electrodes, each of which extends completely across one of said active regions, each of said gate electrodes having an end portion which terminates at another one of said active regions adjacent to said one of said active regions without electrically contacting said another one of said active regions.

2. A semiconductor device according to claim 1, wherein said semiconductor islands are single crystalline silicon.

3. A semiconductor device according to claim 1, wherein said insulator region is silicon dioxide.

4. A semiconductor device according to claim 2, wherein said base body is a material selected from the group consisting of sapphire and spinel.

5. A semiconductor device having an insulating body, comprising:
   semiconductor islands, having sides, formed on the insulating body;
   bridge portions, formed on the insulating body, for connecting said semiconductor islands;
   striped portions formed by oxidizing the sides of said islands;
   wide portions formed by oxidizing said bridge portions, said wide portions and said striped portions extending in different directions, intersecting each other and forming an insulating region;
   a plurality of active regions formed on the insulating body and electrically isolated from each other by said insulating region, said insulating region and said active regions forming a substantially flat surface; and
   electrodes, each of which extends completely across one of said active regions, said electrodes having an end portion which terminates at another one of said active regions adjacent to said one of said active regions without electrically contacting said another one of said active regions.

6. A semiconductor device according to claim 5, wherein said wide portions have a height of approximately 0.6 micrometers.

7. A semiconductor device according to claim 5, wherein said striped portions are very narrow as compared to said wide portions and wherein said wide portions are thin as compared to said striped portions.

8. A semiconductor device according to claim 6, wherein said striped portions have a height of 6 micrometers and a width of 30 nm and wherein said wide, thin portions have a thickness of 30 nm.

9. A semiconductor device according to claim 5, wherein said bridge portions have a thickness of approximately 15 nm.

* * * * *

UNITED STATES PATENT AND TRADEMARK OFFICE
CERTIFICATE OF CORRECTION

PATENT NO. : 4,665,419
DATED : MAY 12, 1987
INVENTOR(S) : NOBUO SASAKI

It is certified that error appears in the above-identified patent and that said Letters Patent is hereby corrected as shown below:

```
*Col. 1, line 17, "comprises" should be --comprise--.

Col. 2, line 7, "insulator the" should be --the insulator--;
         line 46, delete "on";
         line 47, "there" should be --thereon--.

*Col. 4, line 25, "23C" should be --22C--.

*Col. 6, line 23, after "said" insert --semiconductor--.
```

Signed and Sealed this

Thirteenth Day of October, 1987

Attest:

DONALD J. QUIGG

Attesting Officer

Commissioner of Patents and Trademarks